United States Patent
Whitman

Patent Number: 6,147,010
Date of Patent: *Nov. 14, 2000

[54] SOLVENT PREWET AND METHOD TO DISPENSE THE SOLVENT PREWET

[75] Inventor: John Whitman, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/974,015

[22] Filed: Nov. 19, 1997

Related U.S. Application Data

[63] Continuation of application No. 08/749,001, Nov. 14, 1996, abandoned.

[51] Int. Cl.[7] .............................. H01L 21/31; B05D 3/12; B05D 3/10
[52] U.S. Cl. .................... 438/782; 427/240; 427/301; 427/299; 427/346
[58] Field of Search .................................. 427/240, 241, 427/301, 304, 327, 299, 314, 346; 118/52; 430/315, 312, 313; 438/782

[56] References Cited

U.S. PATENT DOCUMENTS

| | | | |
|---|---|---|---|
| 3,950,184 | 4/1976 | Adams et al. | 134/10 |
| 4,190,015 | 2/1980 | Hillman | 118/696 |
| 4,393,807 | 7/1983 | Fujimura et al. | 118/501 |
| 4,518,678 | 5/1985 | Allen | 430/311 |
| 4,996,080 | 2/1991 | Daraktchiev | 427/57 |
| 5,066,616 | 11/1991 | Gordon | 437/229 |
| 5,366,757 | 11/1994 | Lin | 427/9 |
| 5,378,511 | 1/1995 | Cardinali et al. | 427/600 |
| 5,411,836 | 5/1995 | Yoda et al. | 430/190 |
| 5,658,615 | 8/1997 | Hasebe et al. | 427/240 |

*Primary Examiner*—Shrive Beck
*Assistant Examiner*—Michael Barr
*Attorney, Agent, or Firm*—Schwegman, Lundberg, Woessner & Kluth, P.A.

[57] ABSTRACT

A method and apparatus is provided for more efficiently application of photoresist to a wafer surface. One aspect of the method comprises applying solvent to the wafer and spinning it to coat the entire wafer surface prior to the application of photoresist. This reduces surface tension on the wafer and reduces the amount of resist required to achieve a high quality film. The apparatus comprises adding a third solenoid and nozzle to the coating to accommodate the application of solvent tot he center of the wafer surface. The method also describes incorporating a new solvent comprising DI-Acetone Alcohol, which is a low-pressure solvent, providing extended process latitudes and reduced material expenditures.

7 Claims, 2 Drawing Sheets

SOLVENT PREWET AND METHOD TO DISPENSE THE SOLVENT PREWET

This application is a continuation of U.S. patent application Ser. No. 08/749,001, filed on Nov. 14, 1996 now abandoned.

FIELD OF THE INVENTION

The present invention relates in general to processing semiconductor wafers, and particularly to preparing a semiconductor wafer before and after the application of resist.

BACKGROUND OF THE INVENTION

In the lithographic process, a photoresist is applied as a thin film to a substrate (for example, $SiO_2$ on Si), and subsequently exposed through a mask or reticule. The mask contains clear and opaque features that define the pattern which is to be created in the photoresist layer. Areas in the photoresist exposed to light transmitted through the mask are made either soluble or insoluble in a specific type of solution known as a developer. In the case when the exposed regions are soluble, a positive image of the mask is produced in the resist (a positive resist). On the other hand, if the unexposed areas are dissolved by the developer, a negative image results (a negative resist). After developing, the areas no longer covered by resist are removed by etching, thereby replicating the mask pattern in that oxide layer.

Conventional photoresists are three-component materials, consisting of: the resin, which serves as a binder and establishes the mechanical properties of the film; the sensitizer (also called the inhibitor), which is a photoactive compound (PAC); and the solvent (which is different than the developer solution), which keeps the resin in the liquid state until it is applied to the substrate being processed. The sensitizer is the component of the resist material that reacts in response to the actinic radiation (the property of radiant energy by which photochemical changes are produced). The sensitizer gives the resist its developer resistance and radiation absorption properties.

The solvent is usually inert to the incident imaging radiation. That is, it does not undergo chemical change upon irradiation. The solvent and resin combination, however, directly affects the resist film's adhesion and etch resistance characteristics. The combination also determines other film properties of the resist such as thickness, flexibility and thermal flow stability. As a result, the choice of solvent has a direct impact upon process latitudes—the ability to produce critical dimensions within the specification limits in the face of the process variations encountered during production. For example, in order to get the photoresist to disperse properly across the semiconductor wafer the percentage of solvent-to-photoresist volume must be maintained above a certain minimum level. Conventional wafer processes use ethyl lactate (EL) or propyleneglycol monomethylether acetate (PGMEA) as the solvent material. Both of these materials have a relatively high evaporation rate, which accelerates the drying process. To compensate for the high evaporation rate and allow the photoresist to sufficiently disperse, the amount of resist used per wafer must be increased. These conventional processes on average require about 4.5 cc of resist per wafer. When one considers the volume of wafers processed over, for example, a years time, this is a significant amount of resist and a significant part of the cost of processing. What is needed is a way to reduce the amount of resist used without significantly impacting process latitudes. One reason retaining process latitudes is important is because wafer-to-wafer repeatability is enhanced by wider process latitudes.

After several preliminary preparation steps a wafer is ready to be coated with photoresist. The goal of the coating step is to produce a uniform, adherent, defect-free polymeric film of desired thickness over the entire wafer. Spin coating is by far the most widely used technique to apply such films. This procedure is carried out by dispensing the resist solution onto the wafer surface, and then rapidly spinning the wafer until the resist is essentially dry. In order to maintain reproducible line width in VLSI fabrication applications, resist film uniformity across the wafer (and from wafer to wafer) should be within +−100 angstroms.

The spin coating procedure begins with dispensing the resist solution onto the wafer. The dispensing stage can either be accomplished by flooding the entire wafer with resist solution or by dispensing a smaller volume of resist solution at the center of the wafer. The wafer is then brought to a constant speed spin to distribute the solution evenly over the surface. Once the solution is distributed the wafer is dried by extending the spin. Next the wafer is wet with edge bead removal solution to clear away any excess resist material, and then the wafer is spun dry once again.

During conventional processing the wafers are normally brought as quickly as is practical to the final spin speed. High ramping rates have traditionally yielded better film uniformity than low ramping rates. This is due to the fact that the solvent in the resist evaporates rapidly after the resist has been dispensed onto the wafer. Film thickness depends on the viscosity of the liquid resist solution. As a result, extending the time for the solvent to evaporate by using slower spin-ramp speeds contributes to thickness non-uniformity created by the drying and film setting-up tendencies of the solution. High spin-ramp speed, however, contributes to higher maintenance costs resulting from excessive wear on the motor. These same concerns arise when a solvent with a high evaporation rate is employed in a solvent prewet process application.

Wider process latitudes, such as extended processing time, may be obtained by employing a solvent with a slower evaporation rate. Conventional systems spin a wafer having high evaporation rate solvent for no more than one second. In contrast, a process using a low evaporation rate solvent could spin the wafer up to five seconds. This extended spin period would increase the repeatability across fabrication machines. The trend in conventional processes is to modify the spin-ramp speed, compromising between coverage quality and the cost of processing. They use a spin-ramp speed which gives a sufficiently uniform coating of the wafer surface while reducing motor-wear problems. What is needed is a way to maintain film uniformity at lower ramping rates. This would provide the same (or better) quality of wafer coverage, and would result in reduced processing costs by enhancing repeatability and reducing equipment maintenance.

The photoresist is deposited on each wafer after the wafer is mounted in the process bowl of a track coating unit. One partial solution to controlling the amount of solvent (and other photoresist materials) used is to use a chemical dispensing unit which provides tighter control over the amount of solvent deposited on any one wafer. One such system is described in European Patent 618,504, issued to Hasebe. Hasebe describes a system employing a specialized dispensing head which has a single nozzle for dispensing solvent and a single nozzle for dispensing resist solution. Hasebe controls where the material is dispensed on the wafer by moving the dispense head to different locations relative to the wafer. The system disclosed in Hasebe requires, however, a number of specialized devices, including a moveable dispense head, a pump for the solvent and a temperature adjustment mechanism. This type of system reduces the waste of solvent resulting from over-application, as well as increasing wafer-to-wafer consistency due to the more accurate dispensing of the material. This is only a partial solution, however, because even though a variety of units for dispensing chemicals in this manner are marketed, the units designed for low volumes of low viscosity fluids. In addition, each unit is a specialized system, so when a shop wishes to employ such a method the shop has to retrofit or replace existing equipment. This results in reduced production flow, and overhead costs are significantly increased.

What is needed is a way to improve the dispensing of chemicals on conventional systems. There are companies which manufacture a special purpose pump and nozzle system which can be added to their own track coating equipment manufactured. These pumps can dispense small amounts of fluid accurately and repeatably. Such systems attempt to improve resist throughput and yield by simplifying the liquid supply system and making it more precise. However, in addition to the moveable dispense head and the pump itself, the wafer manufacturer must also purchase a pump controller and special circuitry for communication between the track coating system to that controller. In most manufacturing locations fabrication space is at a premium. Where the location is retrofitting existing equipment, there must be room in the equipment for the pump, the pump controller and other special circuitry. As the pump alone can range anywhere from the size of a shoebox to the size of a computer monitor, it becomes difficult for existing facilities to incorporate the conventional specialized dispense systems.

The fabrication recipe also becomes much more complex as a result of having to direct positioning of the dispense head. One effect of this configuration is that these methods are not easily retrofitted or transferrable to other systems. As a result, the problem of elevated processing costs and restricted application still exist. There remains a need for a chemical dispensing system which can be incorporated into a variety of wafer processing equipment without significantly increasing the costs of wafer processing. In addition, there is a continuing need to use the chemicals more efficiently.

SUMMARY OF THE INVENTION

The primary object of the present invention is to eliminate the aforementioned drawbacks of the prior art.

Another object of the present invention is to provide a chemical dispense apparatus which uses less materials and yet produces high quality film on a semiconductor wafer.

A further object of the present invention is to provide a solvent which enables improved performance characteristics of wafer processing equipment.

In order to achieve these objects, as well as others which will become apparent hereafter, a chemical deposition apparatus comprises a solvent dispense head having three nozzles, each nozzle connected to and controlled by a solenoid. The wafer is mounted on a rotatable base, and the solvent dispense head is positioned relative to the wafer such that one nozzle dispenses solvent on the center of the wafer, one dispenses solvent on the top of the wafer, and one dispenses solvent on the back of the wafer.

In another embodiment, a slow-evaporation solvent is used. In one embodiment the solvent comprises a diacetone alcohol. With the use of solvents such as diacetone alcohol the vapor pressure is very low (which means the evaporation rate is very slow). This enables the process to use very little solvent prewet solution (0.3–1.0 cc per wafer) and achieve very good resist thickness profiles with only 0.5 cc of resist per wafer. The results are a very clean film, with good uniformity (generally less than 50 angstroms on an eight-inch wafer) achieved with the use of significantly less of the costly photoresist. In a further embodiment, the same solution is used for both the prewet and solvent material, further simplifying processing.

According to another embodiment, the solvent is dispensed on the center of the wafer and spun to cover the wafer surface immediately prior to dispensing resist on the wafer. The use of a low vapor pressure solvent for pre-treating the surface in this manner establishes equal adhesion properties with much less surface tension. The net result is a clean film coating achieved using less resist material than conventional methods.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
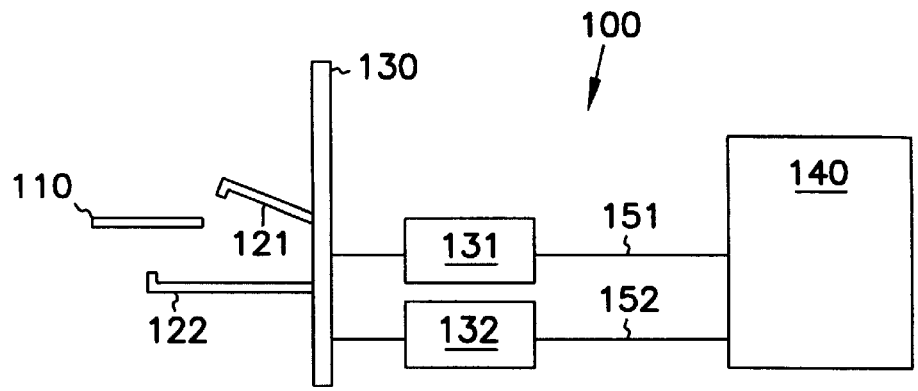
FIG. 1 is a block diagram of a conventional solvent dispensing apparatus.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

By way of definition, in the following text the term "wafer" is intended as a representative reference to the substrate or base upon which an integrated circuit device is to be constructed. The term "resist" or "photoresist" represents any of the set of materials known and used in the art as positive or negative resists.

Conventional processes primarily employ a three-component photoresist, with either ethyl lactate (EL) or propyleneglycol monomethylether acetate (PGMEA) as the preferred solvent component. Both of these substances have a rather high evaporation rate, however, which shrinks the process control window. To compensate, conventional systems use more photoresist as well as a greater percentage of solvent to total photoresist volume. In contrast, according to one aspect of the present invention, a low vapor-pressure solvent is used. In one embodiment a mixture of aliphatic esther and diacetone alcohol is used as the solvent component. The ratio of the materials can range from 10% esther and 90% alcohol, to 30% esther to 70% alcohol. The dissipation rate of this solvent is significantly reduced over conventional solvents because diacetone alcohol has a heavier molecule, creating a very low pressure solvent. The rate of evaporation is up to ten times lower than that of the conventional solvents. One direct result is that semiconductor processing incorporating this type of solvent requires very little solvent to achieve very good resist thickness profiles. With the diacetone alcohol solvent, the process uses as little as 0.3–1.0 cc solvent prewet solution per wafer (as compared to 1.0 cc or greater solvent solution per wafer).

Conventional processes perform the resist deposition step directly after the preliminary wafer preparation. According to one embodiment of the present invention, a pretreatment or prewet step is added and the new step is performed just prior to the resist dispense step. This pretreatment step comprises dispensing solvent onto the wafer, and then spinning the wafer partially dry in order to spread the solvent evenly over the wafer surface. In this embodiment, the same solvent that is used to clean the wafer edges after the photoresist has been deposited is incorporated in the photoresist and is used in the prewet step. Using the same solvent throughout reduces the opportunity for unexpected reactions between the materials, and also simplifies the plumbing requirements.

The presence on the wafer surface of the solvent prior to dispensing resist reduces the surface tension. As a result of the reduced surface tension, when the resist is subsequently dispensed, a clean coat is achieved using substantially less resist material. Good film uniformity is therefore obtained using significantly less solvent. The coat resulting from the resist comprising the solvent as described by the present invention compares favorably with a conventionally created coat when comparing across wafer range and thickness. Furthermore, the coat created following the pretreatment step described by one embodiment of the present invention shows fewer surface defects than a coat created using conventional methods. Including the prewet step reduces the amount of expensive photoresist material used by up to 68%. As an example, where a conventional system dispenses 4.5 cc of photoresist per wafer, a process employing the prewet step reduces the amount of photoresist used to 1.4 cc per wafer. In another example, comparable results are achieved with only 0.5 cc photoresist per wafer. Those skilled in the art will recognize that these examples are offered for illustration only and are not intended to be exclusive or limiting. The reduction in photoresist dispensed also reduces the amount of photo solvent waste, providing additional economic and ecologic benefits.

In spin wafer processing timing is critical in obtaining wafer-to-wafer repeatability. In one embodiment of the present invention, where the slower evaporation rate solvent is employed, timing issues are less critical because the process margins are greater. Mechanical requirements are also less restrictive. The longer dry time associated with reduced evaporation rate allows the machine to more accurately reach the required speed and stabilize at that speed. A further benefit of the slower-drying material is a reduction in film defects, resulting from the resist having more time to flow and evenly distribute across the wafer surface.

Conventional track coating units, shown in FIG. 1, employ a fixed dispense head 130 with two nozzles 121, 122 for dispensing photo resist directly onto the wafer 110. One of the nozzles 121 dispenses solvent on the edge and sides of the wafer for edge bead removal after the photoresist has been spun dry. The other nozzle 122 dispenses solvent on the back of the wafer, again for cleaning the wafer after photoresist deposition. The timing and flow of solvent through each nozzle 121, 122 is controlled by respective solenoids 131, 132. The solenoids are in turn connected to track coating unit logic 140 by wires 151, 152, and triggered by binary coding contained in the recipe executed by logic 140. For example, a binary code of '1' triggers the first solenoid, a binary code of '2' triggers the second solenoid, and a binary code of '3' triggers both solenoids simultaneously.

Figure 2:
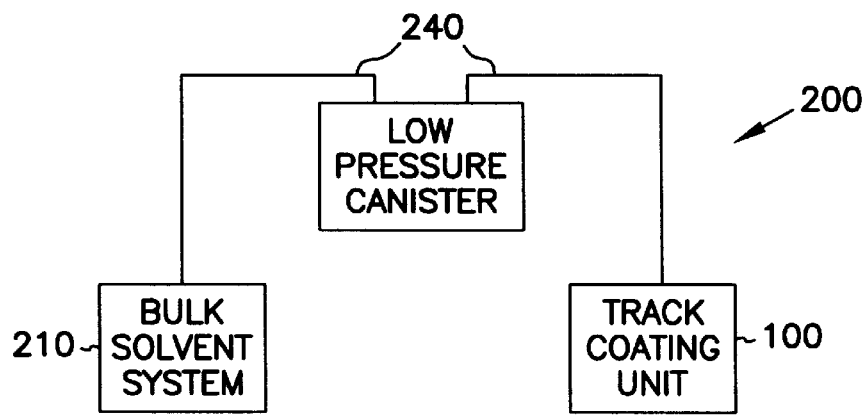
FIG. 2 is a block diagram of a semiconductor wafer processing system incorporating a bulk solvent system.

As shown in FIG. 2, solvent is held in a bulk solvent system 210 external to the track coating unit 100, and connected to the track coating unit 100 through a low pressure canister 220. The low pressure canister 220 maintains the proper fluid pressure and level for the track coating unit. The line carrying the solvent 240 connects to a dispense head 130 within track coating unit 100. Such systems are well-known in the art and so will not be described in further detail.

Figure 3:
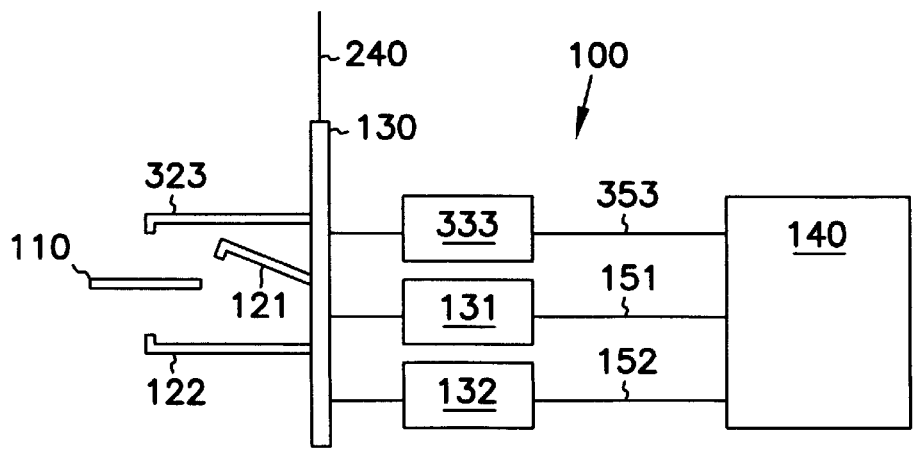
FIG. 3 is a block diagram of a solvent dispensing apparatus according to one embodiment of the present invention.

According to one embodiment of the present invention, represented in FIG. 3, a third nozzle 323 is incorporated into the dispense head 130. The third nozzle 323 is directed at the center of the wafer 110 and is used to dispense solvent prior to photoresist deposition (as described above). This third nozzle 323 is controlled by a third solenoid 333 which is connected to the track coating unit logic 140 via wire 353 so that it too is activated by binary coding in the recipe executed in the unit's logic 140.

One skilled in the art will recognize that the mechanical portions of this improvement (comprising the third nozzle 323 and third solenoid 333) are easily integrated into conventional processing equipment. An additional binary code is also easily incorporated into the recipe to trigger the third nozzle at the desired times. The net result is a simple-to-employ solvent dispense system which is both more reliable and more efficient than conventional systems, and which greatly reduces wafer processing costs. Because the system of the invention requires only the addition of a solenoid and a nozzle, impact on expensive fabrication space is minimized.

Figure 4:
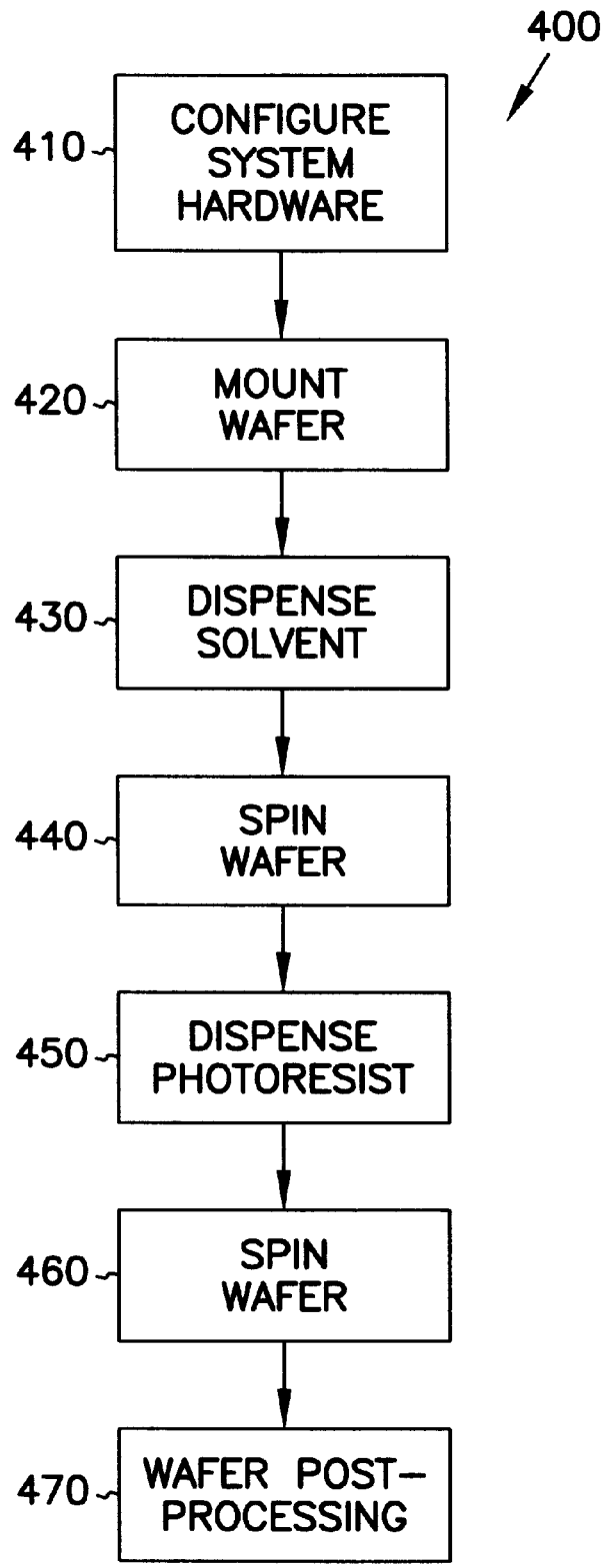
FIG. 4 is a flow diagram describing steps of a wafer coating method according to one embodiment of the present invention.

FIG. 4 is a flow diagram describing steps of a wafer coating method according to one embodiment of the present invention. The initial step, represented by process block 410, is to configure the coating system hardware. According to this embodiment of the present invention, this step includes incorporating a third nozzle into the system and positioning it such that it is directed at the center of a wafer held in the coating system. At process block 420 a wafer is mounted in the coating system. Next (process block 430) solvent is dispensed through the third nozzle onto the wafer. The wafer is then spun at process block 440 to partially dry the solvent and spread it over the surface of the wafer. In one embodiment, a solvent comprising diacetone alcohol is used. This solvent has a slower rate of evaporation, and therefore provides wider processing latitudes. For example, more time is available to bring the wafer up to the correct spin speed, and to ensure complete wafer coverage. Those skilled in the art will recognize that other solvent materials may be used in the implementation of the present invention without exceeding its scope and spirit. Once this wafer prewet process is complete, photoresist is dispensed onto the wafer at process block 450. The wafer is again brought to spin velocity at process block 460. This distributes the resist over the wafer surface. In the embodiment described, the solvent coating the wafer reduces friction and allows the resist to spread more quickly and evenly. Another effect of the lowered resistance is less resist material needs to be dispensed to acheive adequate wafer coverage.

Resist material is made up of three primary parts—resin, photoactive compound, and solvent. In one embodiment the solvent component is the same diacetone alcohol resist used in the prewet step 430. This provides at least two advantages. First, using the same resist material in both the prewet and resist dispense steps reduces the likelihood of unexpected reactions between the materials. Second, the slow evaporation rate of the diacetone alcohol solvent extends the process parameters of the resist, providing more time to spread the resist over the wafer and more time to bring the wafer to the proper spin velocity and stabilize it. The wider process latitudes enable greater wafer-to-wafer consistency throughout the batch. Once the resist spin coat step 460 is complete, post-processing is performed at process block 470. Post-processing includes activities such as edge bead removal. Those skilled in the art will recognize that the above examples are offered for illustration and are not intended to be exclusive or limiting.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

We claim:

1. A method of coating a wafer, comprising:
   selecting a slow-drying solvent, wherein selecting a slow drying solvent includes selecting a solvent having a low vapor pressure, wherein the vapor pressure of the solvent is equal to or is lower than the vapor pressure of diacetone alcohol; wherein said solvent comprises diacetone alcohol;
   dispensing less than 1.0 cc of the solvent on the wafer as a pre-wet step, wherein the less than 1.0 cc of the solvent has an evaporation rate of greater than 1 second;
   spinning the wafer until the solvent is distributed across the wafer surface wherein the low vapor pressure solvent serves as the means for controlling wetting on the wafer surface;
   dispensing a photoresist solution on the wafer having solvent on its surface;
   spinning the wafer until the photoresist is distributed across the wafer surface wherein controlling the wetting on the wafer surface with the low vapor pressure solvent allows for even distribution and wetting of the wafer surface using less solvent than conventional acetate solvents and reduces the surface tension such that the low vapor pressure solvent reduces the amount of photoresist necessary to coat the entire wafer; and
   wherein the longer dry time associated with the low vapor pressure solvent allows the solvent more time to flow and evenly distribute across the wafer surface than possible with conventional acetate solvents which reduces a ramping rate for spinning the wafer as required to flow and evenly distribute a solvent across the wafer surface wherein said conventional acetate solvents are those having higher vapor pressures than diacetone alcohol.

2. The method of claim 1 wherein the step of dispensing the solvent comprises:
   positioning a nozzle to dispense the solvent in the middle of the wafer;
   controlling the nozzle with a solenoid; and
   causing the nozzle to dispense the solvent by signaling the solenoid.

3. The method of claim 1, wherein the step of dispensing a photoresist solution is performed before the solvent on the surface of the wafer is dry.

4. A method of coating a wafer, comprising:
   incorporating an additional nozzle into a wafer processing machine;
   positioning the additional nozzle such that it is directed at the center of a wafer held in the wafer processing machine;
   causing the nozzle to dispense less than 1.0 cc of a solvent on the wafer as a pre-wet step by triggering a solenoid, the solvent having a low vapor pressure, wherein the vapor pressure of the solvent is equal to or is lower than the vapor pressure of diacetone alcohol; wherein said solvent comprises diacetone alcohol;
   spinning the wafer until the solvent is distributed across the wafer surface wherein the low vapor pressure solvent serves as the means for controlling wetting on the wafer surface;
   dispensing a photoresist solution on the wafer having solvent on its surface;
   spinning the wafer until the photoresist is distributed across the wafer surface wherein controlling the wetting on the wafer surface with the low vapor pressure solvent allows for even distribution and wetting of the wafer surface using less solvent than conventional acetate solvents and reduces the surface tension such that the low vapor pressure solvent reduces the amount of photoresist necessary to coat the entire wafer; and
   wherein the longer dry time associated with the low vapor pressure solvent allows the solvent more time to flow and evenly distribute across the wafer surface than possible with conventional acetate solvents which reduces a ramping rate for spinning the wafer as required to flow and evenly distribute a solvent across the wafer surface wherein said conventional acetate solvents are those having higher vapor pressures than diacetone alcohol.

5. The method of claim 4, wherein the step of dispensing a photoresist solution is performed before the solvent on the surface of the wafer is dry.

6. A method of coating a wafer, comprising:
   positioning a nozzle such that it is directed at the center of a wafer;
   controlling the nozzle with a solenoid;
   causing the nozzle to dispense less than 1.0 cc of a solvent on the wafer as a pre-wet step by signaling the solenoid, the solvent having a low vapor pressure, wherein the vapor pressure of the solvent is equal to or is lower than the vapor pressure of diacetone alcohol; wherein said solvent comprises diacetone alcohol;
   spinning the wafer until the solvent is distributed across the wafer surface wherein the low vapor pressure solvent serves as the means for controlling wetting on the wafer surface;
   dispensing a photoresist solution on the wafer before the solvent on the wafer surface is dry;

spinning the wafer until the photoresist is distributed across the wafer surface wherein controlling the wetting on the wafer surface with the low vapor pressure solvent allows for even distribution and wetting of the wafer surface using less solvent than conventional acetate solvents and reduces the surface tension such that the low vapor pressure solvent reduces the amount of photoresist necessary to coat the entire wafer; and wherein the longer dry time associated with the low vapor pressure solvent allows the solvent more time to flow and evenly distribute across the wafer surface than possible with conventional acetate solvents which reduces a ramping rate for spinning the wafer as required to flow and evenly distribute a solvent across the wafer surface wherein said conventional acetate solvents are those having higher vapor pressures than diacetone alcohol.

7. A method of coating a wafer, comprising:

mounting the wafer in a wafer processing machine having a nozzle;

positioning the nozzle such that it is directed at the center of the wafer;

controlling the nozzle with a solenoid;

causing the nozzle to dispense less than 1.0 cc of a solvent on the wafer as a pre-wet step by signaling the solenoid, the solvent having a low vapor pressure, wherein the vapor pressure of the solvent is equal to or is lower than the vapor pressure of diacetone alcohol; wherein said solvent comprises diacetone alcohol;

spinning the wafer until the solvent is distributed across the wafer surface wherein the low vapor pressure solvent serves as the means for controlling wetting on the wafer surface;

dispensing a photoresist solution on the wafer before the solvent on the wafer surface is dry;

spinning the wafer until the photoresist is distributed across the wafer surface wherein controlling the wetting on the wafer surface with the low vapor pressure solvent allows for even distribution and wetting of the wafer surface using less solvent than conventional acetate solvents and reduces the surface tension such that the low vapor pressure solvent reduces the amount of photoresist necessary to coat the entire wafer; and wherein the longer dry time associated with the low vapor pressure solvent allows the solvent more time to flow and evenly distribute across the wafer surface than possible with conventional acetate solvents which reduces a ramping rate for spinning the wafer as required to flow and evenly distribute a solvent across the wafer surface wherein said conventional acetate solvents are those having higher vapor pressures than diacetone alcohol.

* * * * *

UNITED STATES PATENT AND TRADEMARK OFFICE
CERTIFICATE OF CORRECTION

PATENT NO.: 6,147,010

DATED: Nov. 14, 2000

INVENTOR(S): Whitman

It is certified that error appears in the above-identified patent and that said Letters Patent is hereby corrected as shown below:

On the face page, section [57], line 1, delete "more efficiently" and insert --more efficient--, therefor.

On the face page, section [57], line 11, delete "DI-Acetone" and insert --Di-Acetone--, therefor.

In column 3, line 11, delete "units designed" and insert --units are designed--, therefor.

Signed and Sealed this

Twenty-fourth Day of April, 2001

Attest:

NICHOLAS P. GODICI

*Attesting Officer*   Acting Director of the United States Patent and Trademark Office